Nov. 19, 1963 R. A. LOGAN ET AL 3,111,433

METHOD FOR INCREASING THE DOPING LEVEL
OF SEMICONDUCTOR MATERIALS
Filed Jan. 23, 1961

INVENTORS R. A. LOGAN
W. G. SPITZER
F. A. TRUMBORE
BY George S. Indig
ATTORNEY

United States Patent Office 3,111,433

Patented Nov. 19, 1963

3,111,433

METHOD FOR INCREASING THE DOPING LEVEL OF SEMICONDUCTOR MATERIALS

Ralph A. Logan, Morristown, and William G. Spitzer and Forrest A. Trumbore, Plainfield, N.J., assignors to Bell Telephone Laboratories, Incorporated, New York, N.Y., a corporation of New York Filed Jan. 23, 1961, Ser. No. 83,972
6 Claims. (Cl. 148—13)

Figure 1:
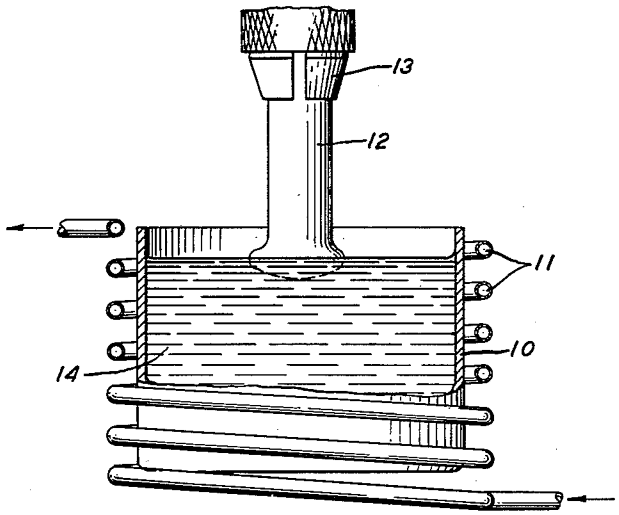

This invention relates to a method for preparing highly doped single crystal semiconductor materials of particular interest for use in devices based on the tunnel principle.

Over the past decade the art has developed various methods for growing constant resistivity semiconductor materials of a resistivity range suitable for use in conventional rectifiers, transistors and the like. Such materials, based on semiconductor systems such as germanium, silicon, or any of the group III–V or II–VI compounds, typically contain of the order of $10^{16}$ atoms per cubic centimeter of uncompensated significant impurity. Such systems, as well as crystallization procedures appropriately utilized for that preparation, are well known.

Recently there has been a birth of interest in a class of devices based on internal emission. These devices operating on the tunnel principle, include the backward diode and, most lately, the Esaki diode. Most efficient operation of such devices requires very short junction depth to increase the statistical likelihood of tunneling and permit observation of the negative resistance characteristic. A further desirable aspect of Esaki diodes for device applications is a large current density which permits operation of the device at high frequencies. Such junction characteristics are most easily obtained by use of degenerate or near degenerate semiconductor materials, typically containing an impurity content of the order of $10^{19}$ atoms per cubic centimeter or greater.

Unfortunately, growth of such low resistivity materials of the required crystalline perfection and uniformity of impurity distribution has met with some difficulty. The materials in which the art is particularly interested for tunnel diode use, for example, arsenic doped germanium, contain a significant impurity evidencing so high a volatility at the melt temperature for this concentration level composition as to make impurity control difficult.

A desirable characteristic of Esaki diodes for device applications as noted above is a large current density. Typically, this is optimized by fabricating such diodes from a high doped semiconductor material. Heretofore, there has been an apparent saturation in the arsenic concentration, well below the solubility limited in arsenic doped germanium crystals. Thus, by the use of conventional crystal growing techniques, arsenic doped germanium crystals evidencing a maximum carrier concentration within the range of $3–5 \times 10^{19}$ atoms cm.$^{-3}$ have been obtained whereas anticipated concentrations were of the order of twice that range.

Measurements of impurity concentrations in arsenic doped germanium crystals, regardless of the method of crystal growth have suggested that far less arsenic appears in the solution in the crystal than one would normally anticipate from the growth conditions. This result may be attributed to occlusions of germanium arsenide in the crystal or to precipitation of arsenic at dislocations.

In accordance with this invention a technique is described for the preparation of uniformly doped crystals of germanium containing arsenic as a significant impurity. Utilizing the inventive technique discussed herein, the arsenic doping level of germanium crystals has been increased from initial values of $3–5 \times 10^{19}$ atoms cm.$^{-3}$ to values within the range of $8–9 \times 10^{19}$ atoms cm.$^{-3}$ by a novel combination of heat treatment and quenching of crystals grown by prior art techniques. The use of these materials in the fabricating of Esaki diodes has resulted in improved current densities, peak to valley current ratios and uniformity of diodes as compared to those diodes fabricated from germanium heretofore available.

Figure 2:
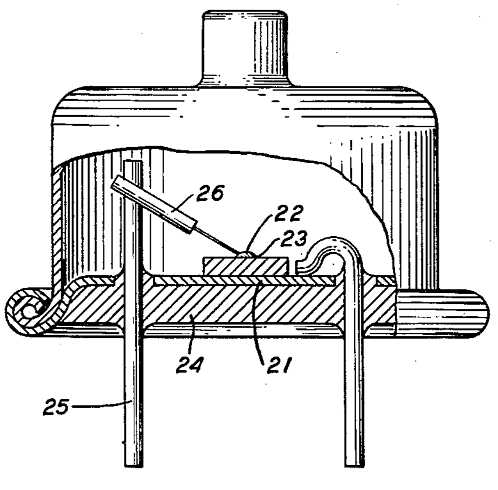

Other advantages and various features of the invention will become apparent by reference to the following description taken in conjunction with the accompanying drawing forming a part thereof and from the appended claims wherein:

FIG. 1 is a diagrammatic front elevational view in section of suitable apparatus employed in preparing arsenic doped germanium crystals for use in the present invention wherein a solvent evaporation technique is employed; and FIG. 2 is a front elevational view of an Esaki diode utilizing arsenic doped germanium prepared in accordance with the present inventive technique.

Referring more particularly to FIG. 1, the semiconductor melt is contained in a suitable crucible 10, of a material such as graphite or fused silica, which is heated by external energy source 11. Seed crystal 12 is held in shaft 13 which is rotated in melt 14 during the operation of the process.

An exemplary procedure for preparing germanium crystals according to the solvent evaporation technique is as follows:

A melt is prepared by mixing germanium of a weight of the order of 100 grams with approximately 10 grams of germanium arsenide in a graphite crucible, the final composition having a total arsenic concentration within the range of 0.5 to 40 percent by weight.

The crucible is then inserted into an apparatus such as that shown in FIG. 1. Helium is next flowed through the apparatus, passing above the crucible for the purpose of flushing air and to prevent the oxidation of germanium and arsenic.

Next, the mixture is heated to a temperature at which it is completely molten. This temperature is dependent upon the concentration of arsenic in the melt and is within the range of 740 to 933° C. The melting point of a 40 percent arsenic mixture is approximately 740° C., so indicating the lower limit, whereas an 0.5 percent arsenic mixture melts at a temperature of approximately 935° C.

Following this, a seed crystal of germanium is lowered into the crucible to a depth of approximately 1/16 of an inch. The temperature of the melt is then lowered until the crystal begins to grow outwardly and this is determined by the composition of the solution. Thus, a 5 percent arsenic melt results in initiation of crystallization at about 920° C. whereas a 10 percent arsenic melt initiates arsenic growth at about 900° C. The initial deposition of germanium on the seed crystal is then removed by increasing the temperature, so melting this deposition which may be polycrystalline in nature and contain occlusions.

Following the germanium removal step the temperature is maintained at that level at which the initial deposition of germanium was melted for a period of the order of 18 hours. Arsenic evaporates from the melt during the entire period, so enriching the system with respect to the germanium to saturation and resulting in the deposition of material of the saturation composition on the seed crystal.

In order to determine the composition of the end product, reference is made to compositional diagrams, for example, to FIGS. 1 and 2 appearing on pages 208 and 210 respectively in the June 1960 issue, volume 39, No. 1, of the Bell System Technical Journal.

An alternative method for preparing arsenic doped germanium crystals for use in the present invention is known as thermal gradient crystal growth. A typical procedure for crystal growth according to this technique is described and explained by F. A. Trumbore in an article appearing in Journal of the Electrochemical Society, volume 103, pages 597 through 600, November 1956.

Crystals grown according to the techniques discussed above generally manifest a carrier concentration within the range of $3–5\times10^{19}$ atoms cm.$^{-3}$. The crystals so grown are mechanically sliced into samples, typically of the order of 0.025 inch by 0.090 inch by 0.60 inch, so as to be more readily adaptable for the application of the present inventive techniques. The sliced sample is next etched in order to remove crystalline imperfections caused by the mechanical slicing technique. A suitable material for this purpose is CP–4 standard etch.

The etched sample is then heated in an inert gaseous ambient to a temperature within the range of 800 to 900° C. for a time period of the order of 1 to 60 minutes. The upper limit of temperature is occasioned by the melting point of germanium (937° C.), thus suggesting 900° C. as a practical upper limit whereas at temperatures appreciably below 800° C. the mobility of the arsenic atoms is too small to be of significance. Heating for less than 1 minute fails to produce appreciable diffusion whereas heating for more than 1 hour causes undue vaporization and loss of arsenic. Optimum results are obtained by heating the crystals at a temperature of 870° C. for a time period within the range of 15 to 30 minutes.

Next, following the heat treatment, the crystal is cooled to a temperature of the order of 500° C. within a time period in the range of 1 to 5 seconds by flowing a nitrogen stream through the furnace. The rapid quenching reduces the mobility of the arsenic, so precluding this material from reprecipitating. The crystal is then cooled to room temperature for a time period of the order of 5 minutes.

As an alternative procedure for cooling, the sample may be rapidly removed from the furnace and inserted into an ethylene glycol bath or other liquid coolant, such as water, oil, etc.

The crystalline samples so treated may evidence a carrier concentration within the range of $8–9\times10^{19}$ atoms cm.$^{-3}$ indicating that the carrier concentration in the germanium has been increased by a factor of two above the initial concentration. These materials may then be used in the fabrication of Esaki diodes.

An Esaki diode utilizing an arsenic doped germanium crystal prepared in accordance with the present invention is shown in FIG. 2. Diode 21 is fabricated on n-type germanium having an impurity concentration of $8–9\times10^{19}$ atoms cm.$^{-3}$. Indium, with small additions of gallium, is alloyed to the germanium in the form of a sphere 22 forming the p-n junction 23. The alloying is performed on a variac-controlled strip heater utilizing an atmosphere of hydrogen which has been dehydrated by passage through a deoxo unit and a pair of liquid nitrogen traps. In order to eliminate cutting following the alloying cycle, the unit to be mounted is alloyed on a 40 mil square. The square is bonded directly to gold plated leader 24 at a temperature of 425° C. After bonding, the temperature is lowered to approximately 200° C., a temperature at which the indium-gallium alloy is liquid and permits the embedding of a 1 mil gold wire therein. The other end of this lead is welded to one of the insulated posts 25 by means of a nickel sleeve 26.

Examples of the present invention are set forth below. They are intended merely as illustrations, and it is to be appreciated that the process described may be varied by one skilled in the art without departing from the spirit and scope of the invention.

*Example 1*

A single crystal of arsenic doped germanium was grown by the thermal gradient technique wherein 250 grams of germanium and 50 grams of arsenic were employed as starting materials. The crystal was grown for 26 days at a temperature in the range of 750 to 850° C. with an average thermal gradient of approximately 10° C. per cm. The melt composition varied between 25 and 40 atom percent arsenic in germanium. Following the growth of the crystal it was sliced into samples approximately 0.025 inch x 0.090 inch by 0.60 inch. The resistivity and carrier concentration were found to be $6.65\times10^{-4}$ ohm-cm. and $5.1\times10^{19}$ atoms cm.$^{-3}$ respectively. The sliced samples were cleaned by etching in CP–4 and heated to 870° C. for 15 minutes using a small furnace heated by R-F induction. At the end of the heating cycle the furnace was turned off and a large volume of nitrogen was permitted to flow freely through the furnace so that the sample cooled to 500° C. in about 4 seconds and to room temperature in about 30 seconds. The resistivity and carrier concentration of the sample were again measured and found to be $5.0\times10^{-4}$ ohm-cm. and $8.1\times10^{19}$ atoms cm.$^{-3}$ respectively.

*Example 2*

A single crystal of arsenic doped germanium was grown from a melt containing 13 atom percent arsenic by the solvent evaporation technique discussed above. The resistivity of this crystal was $6.8\times10^{-4}$ ohm-cm. Samples were prepared, as described in Example 1, and heated at 870° C. for 30 minutes and quenched according to the method described in the above example. The resistivity was then found to be $6.0\times10^{-4}$ ohm-cm.

The inventive methods described are most suited for manufacturing tunnel diodes. With such devices it is desirable to have a material of low resistivity evidencing crystalline perfection and uniformity of impurity distribution. Once having obtained this material the tunnel diodes may be prepared in accordance with the procedure as set forth in the 1959 I.R.E. Wescon Convention Record, Part 3, pages 9 through 31.

While the invention has been described in detail in the foregoing description and the drawing similarly illustrates the same, the aforesaid is by way of illustration only and is not restrictive in character. The several modifications which will readily suggest themselves to persons skilled in the art, are all considered within the broad scope of this invention, reference being had to the appended claims.

What is claimed is:

1. A method for preparing a highly doped arsenic-germanium crystal from a crystal having a maximum carrier concentration within the range of $3–5\times10^{19}$ atoms cm.$^{-3}$ which comprises the steps of heating the said crystal at a temperature within the range of 800–900° C. for a time period within the range of 1–60 minutes and quenching the said crystal to a temperature of the order of 500° C. in a time period within the range of 1–5 seconds, and permitting the crystal to cool to room temperature.

2. A method according to the procedure of claim 1 wherein said quenching is conducted by flowing nitrogen over the said crystal.

3. A method according to the procedure of claim 1 wherein said arsenic doped germanium crystal is prepared by solvent evaporation.

4. A method according to the procedure of claim 1 where said arsenic doped germanium crystal is prepared by the thermal gradient technique.

5. A method according to the procedure of claim 1 wherein said arsenic doped germanium crystal is heated at a temperature of 870° C. for a time period within the range of 15–30 minutes.

6. A method according to the procedure of claim 1 wherein said crystal is quenched by means of a liquid coolant.

References Cited in the file of this patent

UNITED STATES PATENTS

| | | |
|---|---|---|
| 2,669,533 | Dunlap | Feb. 16, 1954 |
| 2,694,168 | North et al. | Nov. 9, 1954 |
| 2,785,096 | Adcock | Mar. 12, 1957 |
| 2,798,826 | Klement | July 9, 1957 |
| 2,966,434 | Hibberd | Dec. 27, 1960 |
| 3,007,819 | McNamara | Nov. 7, 1961 |
| 3,033,714 | Ezaki et al. | May 8, 1962 |

FOREIGN PATENTS

| | | |
|---|---|---|
| 632,980 | Great Britain | Dec. 5, 1949 |